(12) United States Patent
Lee et al.

(10) Patent No.: US 8,652,342 B2
(45) Date of Patent: Feb. 18, 2014

(54) SEMICONDUCTOR FABRICATION APPARATUSES TO PERFORM SEMICONDUCTOR ETCHING AND DEPOSITION PROCESSES AND METHODS OF FORMING SEMICONDUCTOR DEVICE USING THE SAME

(75) Inventors: Kyung-Woo Lee, Hwaseong-si (KR); Jin-Sung Kim, Suwon-si (KR); Joo-Byoung Yoon, Yongin-si (KR); Yeong-Cheol Lee, Seoul (KR); Sang-Jun Park, Hwaseong-si (KR); Hee-Kyeong Jeon, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 0 days.

(21) Appl. No.: 13/468,080

(22) Filed: May 10, 2012

(65) Prior Publication Data

US 2012/0220110 A1 Aug. 30, 2012

Related U.S. Application Data

(62) Division of application No. 12/033,266, filed on Feb. 19, 2008, now Pat. No. 8,197,637.

(30) Foreign Application Priority Data

Feb. 27, 2007 (KR) .................................. 2007-19753

(51) Int. Cl.
*B44C 1/22* (2006.01)
*C03C 25/68* (2006.01)
*C23F 1/00* (2006.01)

(52) U.S. Cl.
USPC ............... 216/67; 216/37; 216/39; 216/41; 216/58; 216/61; 216/69; 216/71; 216/72; 216/74; 216/75; 216/79; 216/81; 156/345.44; 156/345.45; 156/345.46; 438/694; 438/695; 438/700; 438/710; 438/726; 118/715; 118/720; 118/723 R; 118/723 MW

(58) Field of Classification Search
USPC .......... 216/37, 39, 41, 58, 61, 67, 69, 71, 72, 216/74, 75, 79, 81; 156/345.43, 345.44, 156/345.45, 345.46; 118/715, 720, 721, 118/723 R, 723 MW; 438/694, 695, 700, 438/707, 710, 726
See application file for complete search history.

(56) References Cited

U.S. PATENT DOCUMENTS 7,250,373 B2 * 7/2007 Mui et al. ...................... 438/714
7,618,548 B2 * 11/2009 Chinn et al. ...................... 216/2

(Continued)

FOREIGN PATENT DOCUMENTS

| | | |
|---|---|---|
| JP | 2002-334879 | 11/2002 |
| KR | 10-343286 | 6/2002 |

(Continued)

OTHER PUBLICATIONS

J. Reece Roth: "Applications to Nonthermal Plasma Processing", Industrial Plasma Engineering; vol. 2, pp. 582-584.

(Continued)

*Primary Examiner* — Nadine Norton
*Assistant Examiner* — Christopher Remavege
(74) *Attorney, Agent, or Firm* — Stanzione & Kim, LLP

(57) ABSTRACT

A semiconductor fabrication apparatus and a method of fabricating a semiconductor device using the same performs semiconductor etching and deposition processes at an edge of a semiconductor substrate after disposing the semiconductor substrate at a predetermined place in the semiconductor fabrication apparatus. The semiconductor fabrication apparatus has lower, middle and upper electrodes sequentially stacked. The semiconductor substrate is disposed on the middle electrode. Semiconductor etching and deposition processes are performed on the semiconductor substrate in the semiconductor fabrication apparatus. The semiconductor fabrication apparatus forms electrical fields along an edge of the middle electrode during performance of the semiconductor etching and deposition processes.

17 Claims, 8 Drawing Sheets

(56) References Cited

U.S. PATENT DOCUMENTS

| | | | |
|---|---|---|---|
| 7,722,925 B2 * | 5/2010 | White et al. | 427/248.1 |
| 8,221,582 B2 * | 7/2012 | Patrick et al. | 156/345.34 |
| 2008/0110859 A1 * | 5/2008 | Koshiishi et al. | 216/67 |
| 2008/0286978 A1 * | 11/2008 | Chen et al. | 438/713 |
| 2009/0166326 A1 * | 7/2009 | Sexton et al. | 216/67 |

FOREIGN PATENT DOCUMENTS

| | | | | |
|---|---|---|---|---|
| KR | 2003-0060690 | * | 7/2003 | 216/67 |
| KR | 10-439940 | | 7/2004 | |
| KR | 2004-103911 | | 12/2004 | |
| KR | 10-605933 | | 7/2006 | |

OTHER PUBLICATIONS

Korean Communication issued in KR 2007-19753.

J. Reece Roth: "Applications to Nonthermal Plasma Processing", Industrial Plasma Engineering; vol. 2, pp. 582-584, Published Dec. 15, 2001, source Google.

* cited by examiner

SEMICONDUCTOR FABRICATION APPARATUSES TO PERFORM SEMICONDUCTOR ETCHING AND DEPOSITION PROCESSES AND METHODS OF FORMING SEMICONDUCTOR DEVICE USING THE SAME

CROSS-REFERENCE TO RELATED APPLICATIONS

This patent application is a Divisional application of prior application Ser. No. 12/033,266, filed on Feb. 19, 2008 now U.S. Pat. No. 8,197,637 in the United States Patent and Trademark Office, which claims priority under 35 U.S.C. §119(a) from Korean Patent Application No. 10-2007-0019753, filed Feb. 27, 2007, the contents of which are hereby incorporated by reference in its entirety.

BACKGROUND OF THE INVENTION

1. Field of the Invention

The present general inventive concept relates to semiconductor fabrication apparatuses and methods of forming a semiconductor device using the same, and more particularly, to semiconductor fabrication apparatuses to perform semiconductor etching and deposition processes and methods of forming the semiconductor device using the same.

2. Description of the Related Art

Typically, semiconductor devices are fabricated using a semiconductor substrate and a material layer. Here, the semiconductor devices may be configured to correspond to predetermined regions of the semiconductor substrate, respectively, thereby having electrical characteristics corresponding to the material layer. The material layer may be formed by performing a semiconductor deposition process on the semiconductor substrate. The predetermined region of the semiconductor substrate may be formed by performing a semiconductor photolithography process on the semiconductor substrate. After performing of the semiconductor photolithography and deposition processes, the semiconductor substrate may be exposed to a semiconductor etching process together with the material layer to form semiconductor devices.

However, the semiconductor etching process may be performed to expose a main surface of the semiconductor substrate through a material layer, and form residues of the material layer in a bevel region of the semiconductor substrate. The residues of the material layer are different in number depending on characteristics of the semiconductor etching process and formed in the bevel region of the semiconductor substrate. The residues of the material layer may be transferred from the bevel region of the semiconductor substrate to the main surface of the semiconductor substrate to electrically short-circuit semiconductor devices through the semiconductor etching process or subsequent semiconductor fabrication processes after performing the semiconductor etching process.

A method of preventing occurrence of residues of an insulating layer (corresponding to a material layer) in a bevel region of the semiconductor substrate is disclosed in Japanese Patent Laid-open Publication No. 2002-334879, filed by Fukata Shinichi et al. According to Japanese Patent Laid-open Publication No. 2002-334879, an insulating layer covering a peripheral region and a bevel region of a semiconductor substrate is formed. A passivation layer is formed in the bevel region of the semiconductor substrate to be disposed on the insulating layer. An interconnection groove is formed in the insulating layer by performing a semiconductor etching process on the insulating layer to expose the semiconductor substrate. The passivation layer protects the insulating layer in the bevel region of the semiconductor substrate during the etching process and prevents occurrence of the residues of the insulating layer in the bevel region of the semiconductor substrate.

However, the method disclosed in Japanese Patent Laid-open Publication No. 2002-334879 includes performing a semiconductor deposition process twice in different places of a semiconductor fabrication line not to make residues of the insulating layer in the bevel region of the semiconductor substrate. The two-time semiconductor deposition processes are performed using techniques of chemical vapor deposition (CVD) and organic material coating. Thus, the semiconductor substrate has to be moved to semiconductor fabrication apparatuses disposed in different places to perform the semiconductor deposition process twice. Thus, the method according to Japanese Patent Laid-open Publication No. 2002-334879 may prolong a processing time for forming the interconnection groove relating to the residues of the insulating layer, thereby increasing production cost of the semiconductor device.

SUMMARY OF THE INVENTION

The present general inventive concept provides a semiconductor fabrication apparatus to perform semiconductor etching and deposition processes at an edge of a semiconductor substrate by depositing the semiconductor substrate at a proper position.

The present general inventive concept also provides a method of forming a semiconductor device using a semiconductor fabrication apparatus to perform semiconductor etching and deposition processes at an edge of a semiconductor substrate to shorten a moving line of the semiconductor fabrication process.

The present general inventive concept also provides a semiconductor fabrication apparatus and method of forming a semiconductor device using the same, which is suitable to perform semiconductor etching and deposition processes at an edge of a semiconductor substrate.

Additional aspects and utilities of the present general inventive concept will be set forth in part in the description which follows and, in part, will be obvious from the description, or may be learned by practice of the general inventive concept.

The foregoing and/or other aspects and utilities of the general inventive concept may be achieved by providing a semiconductor fabrication apparatus including a lower body to perform semiconductor etching and deposition processes. The lower body has lower and middle electrodes. The lower electrode is formed to have a larger diameter than a diameter of the middle electrode concentrically aligned to the lower electrode. An upper body is disposed on the lower body. The upper body has an upper electrode and a gas induction housing. The upper electrode is formed to have a larger diameter than a diameter of the gas induction housing concentrically aligned to the upper electrode. The upper, middle and lower electrodes are electrically connected to one another. The gas induction housing and the middle electrode project from the upper and lower electrodes to be disposed to face each other. Intensity of an electrical field between the upper, middle and lower electrodes gradually decreases toward an edge between the gas induction housing and the middle electrode from the edge between the upper electrode and the lower electrode.

The foregoing and/or other aspects and utilities of the general inventive concept may also be achieved by providing a method of forming a semiconductor device, the method including using a semiconductor fabrication apparatus to perform semiconductor etching and deposition processes. The semiconductor fabrication apparatus has lower and upper bodies facing each other to sequentially dispose gas tubes, an upper electrode and a gas induction housing in the upper body, and to dispose middle and lower electrodes in the lower body from top to bottom. In addition, a semiconductor substrate is prepared to be inserted into the semiconductor fabrication apparatus. The semiconductor substrate is mounted on the middle electrode. Etching process gases are injected between the upper and lower electrodes. An etching power recipe is set to the upper, middle and lower electrodes to perform a semiconductor etching process on the semiconductor substrate. After performing the semiconductor etching process, the etching process gases are removed from between the upper and lower electrodes. Subsequently, deposition process gases are injected between the upper and lower electrodes. A deposition power recipe is set to the upper, middle and lower electrodes to perform a semiconductor deposition process on the semiconductor substrate. The etching and deposition process gases are converted into plasma corresponding thereto and the plasma is disposed along an edge of the semiconductor substrate during the semiconductor etching and deposition processes, according to the etching and deposition power recipes.

The foregoing and/or other aspects and utilities of the general inventive concept may also be achieved by providing a method of a semiconductor fabrication apparatus, the method including providing a lower body having lower and middle electrodes having first and second diameters, respectively, providing an upper body disposed on the lower body, and having an upper electrode and a gas induction housing having third and fourth diameters, respectively, and electrically connecting the upper, middle, and lower electrodes such that intensity of an electrical field among the upper, middle, and lower electrodes gradually decreases toward an edge between the gas induction housing and the middle electrode from an edge between the upper electrode and the lower electrode.

The foregoing and/or other aspects and utilities of the general inventive concept may also be achieved by providing a semiconductor fabrication apparatus including a plurality of electrodes electrically connected to each other to form electrical fields, a substrate receiving portion disposed on one of the electrodes to receive a semiconductor substrate, and gas tubes disposed on one or more of the electrodes to transfer etching and deposition process gases to be converted into plasma, wherein the plasma is formed along an edge of the semiconductor substrate corresponding to intensities of the electrical fields.

The plurality of electrodes may be aligned with each other along a center line.

The plurality of electrodes may have a diameter and at least one of the respective diameters may be larger than the other diameters.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
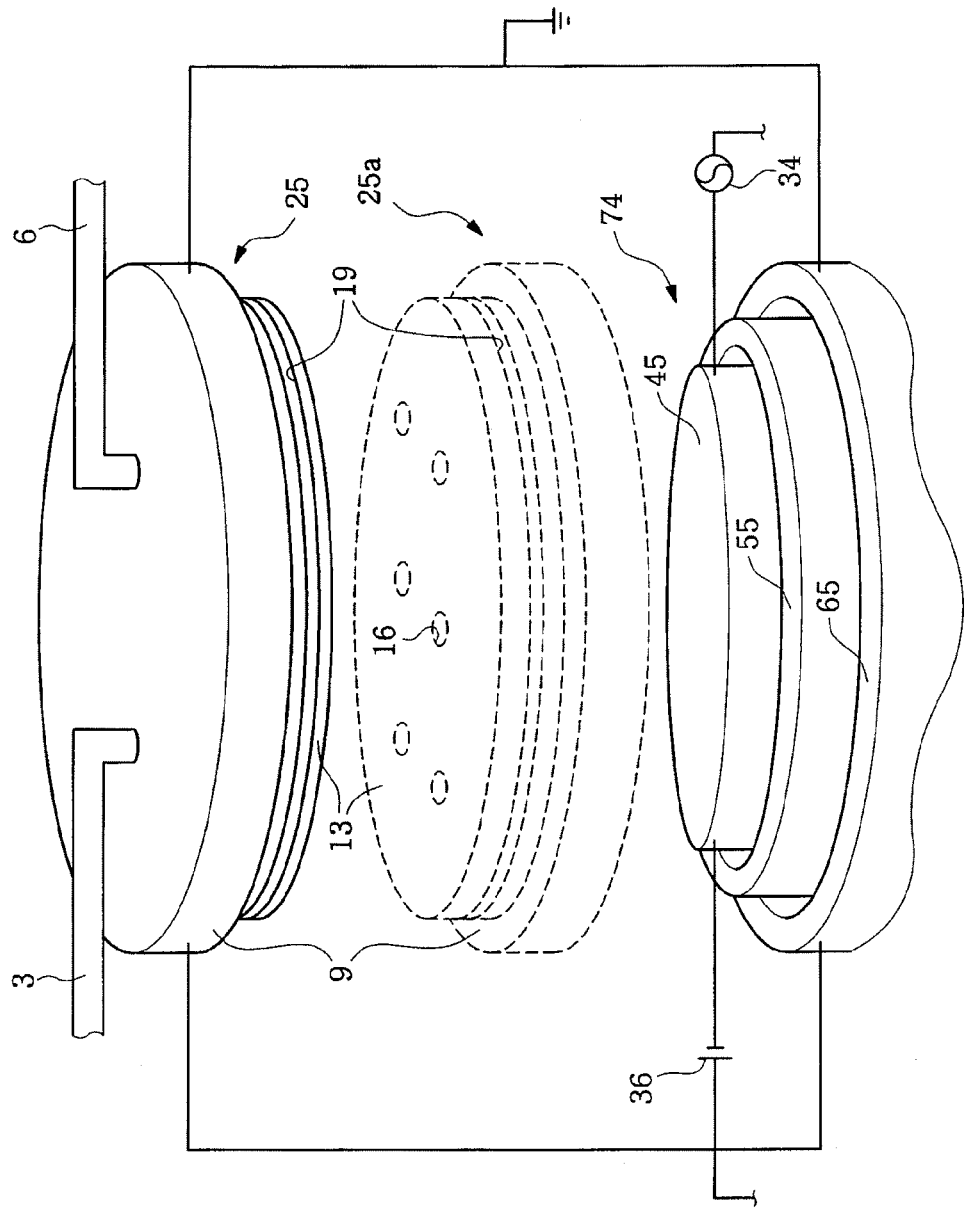
FIG. 1 is a schematic view illustrating a semiconductor fabrication apparatus according to an embodiment of the present general inventive concept.

Reference will now be made in detail to embodiments of the present general inventive concept, examples of which are illustrated in the accompanying drawings, wherein like reference numerals refer to the like elements throughout. The embodiments are described below in order to explain the present general inventive concept by referring to the figures.

Semiconductor fabrication apparatus to perform semiconductor etching and deposition processes of the present general inventive concept will now be described in detail with reference to the accompanying drawings.

FIG. 1 is a schematic view illustrating a semiconductor fabrication apparatus according to an embodiment of the present general inventive concept.

Referring to FIG. 1, the semiconductor fabrication apparatus 80 according to the present embodiment includes a lower body 74. The lower body 74 has a lower electrode 65, an insulating housing 55 and a middle electrode 45. The middle electrode 45 has a same center as the lower electrode 65. The lower electrode 65 may have a larger diameter than the middle electrode 45. The insulating housing 55 is disposed between the lower electrode 65 and the middle electrode 45. The insulating housing 55 may electrically isolate the lower electrode 65 and the middle electrode 45 from each other and have a cooling system to thermally stabilize the middle electrode 45. The middle electrode 45, the insulating housing 55 and the lower electrode 65 separately have top surfaces, which are disposed at different levels from one another, respectively. The middle electrode 45 may be formed to be surrounded by the insulating housing 55 which may be formed to be surrounded by the lower electrode 65.

An upper body 25 is disposed on the lower body 74. The upper body 25 has first and second gas tubes 3 and 6, an upper electrode 9 and a gas induction housing 13. The gas induction housing 13 and the upper electrode 9 have the same center. The upper electrode 9 may have a larger diameter than the gas induction housing 13. The center of the upper electrode 9 and the gas induction housing 13 may be disposed on the same line as the center of the middle electrode 45 and the lower electrode 65. The gas induction housing 13 has a strip-shaped gas inducer 19 along a sidewall of the induction housing 13. The gas induction housing 13 may have hole-shaped gas inducers (not illustrated) along the sidewall of the induction housing 13. Turning over bottom and top surfaces of the upper body 25 (as illustrated in dotted lines), the gas induction housing 13 has gas holes 16 in its surface facing the middle electrode 45.

The gas induction housing 13 and the middle electrode 45 project from the upper electrode 9 and the lower electrode 65 to face each other. The middle electrode 45 has a different diameter from the gas induction housing 13. To this end, the middle electrode 45 may have a smaller diameter than the gas induction housing 13. The middle electrode 45 may have a larger diameter than the gas induction housing 13. Alternatively, the middle electrode 45 may have a same diameter as the gas induction housing 13. The first and second gas tubes 3 and 6 are disposed on an upper electrode. The first gas tube 3 is in communication with gas holes 16 through the upper electrode 9 and the gas induction housing 13. When the gas induction housing 13 has a strip-shaped gas inducer 19, the second gas tube 6 is in communication with the gas inducer 19 through the upper electrode 9 and the gas induction housing 13. When the gas induction housing 13 has hole-shaped gas inducers, the second gas tube 6 may be in communication with the gas inducers through the upper electrode 9 and the gas induction housing 13.

Referring again to FIG. 1, the semiconductor fabrication apparatus 80 includes upper, middle and lower electrodes 9, 45 and 65, and may perform etching and deposition processes. An etching power recipe is set to the upper, middle and lower electrodes 9, 45 and 65 to correspond to the semiconductor etching process. According to the semiconductor etching process, the upper, middle and lower electrodes 9, 45 and 65 may be electrically connected to one another. The upper and lower electrodes 9 and 65 have a same polarity in the etching power recipe. A portion of the etching power recipe may ground the upper and lower electrodes 9 and 65, and apply radio frequency (RF) power 34 to the middle electrode 45. The remaining etching power recipe may apply bias power 36 to the upper and lower electrodes 9 and 65 to generate a higher electrical potential than the middle electrode 45.

In order to correspond to the semiconductor deposition process, a deposition power recipe is set to the upper, middle and lower electrodes 9, 45 and 65. The upper and lower electrodes 9 and 65 have the same polarity in the deposition power recipe. A portion of the deposition power recipe may ground the upper and lower electrodes 9 and 65, and apply RF power 34 to the middle electrode 45. The remaining deposition power recipe may apply bias power 36 to the upper and lower electrodes 9 and 65 to generate a higher electrical potential than the middle electrode 45. The semiconductor deposition process may have different RF power 34 or bias power 36 than the semiconductor etching process. On the other hand, a different deposition power recipe may be set to the upper, middle and lower electrodes 9, 45 and 65 to correspond to the semiconductor deposition process. The upper and lower electrodes 9 and 65 may have the same polarity in the different deposition power recipe. The different deposition power recipe may ground the upper and lower electrodes 9 and 65, and apply the RF power 34 to the lower electrode 45. Intensities of an electrical field between the upper, middle and lower electrodes 9, 45 and 65 are gradually reduced toward an edge between the gas induction housing 13 and the middle electrode 45 from an edge between the upper and lower electrodes 9 and 65.

Next, methods of forming a semiconductor device using semiconductor fabrication apparatus to perform semiconductor etching and deposition processes of the present general inventive concept will be described with reference to the drawings.

Figure 2:
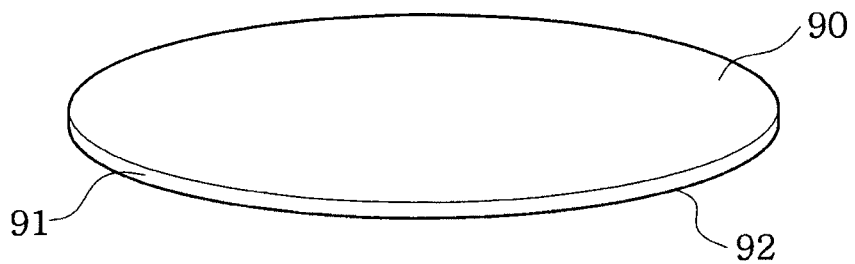
FIGS. 2 to 8 are schematic views illustrating a method of forming a semiconductor device using the semiconductor fabrication apparatus of FIG. 1 according to an exemplary embodiment of the present general inventive concept, respectively.
Figure 3:
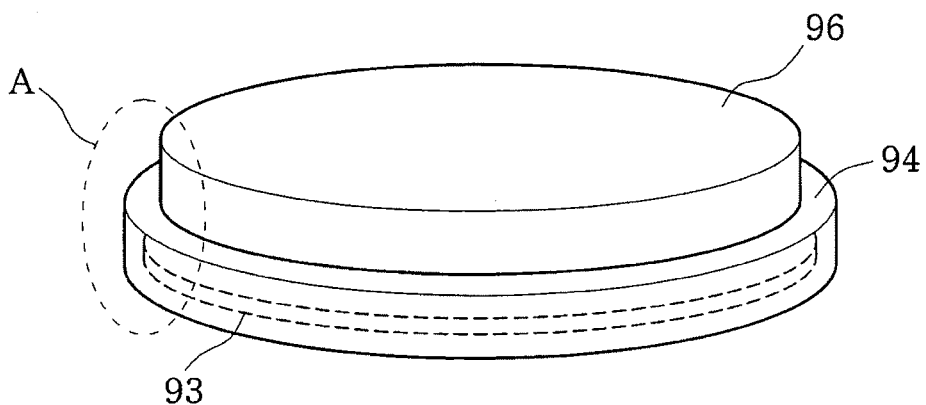
Figure 4:
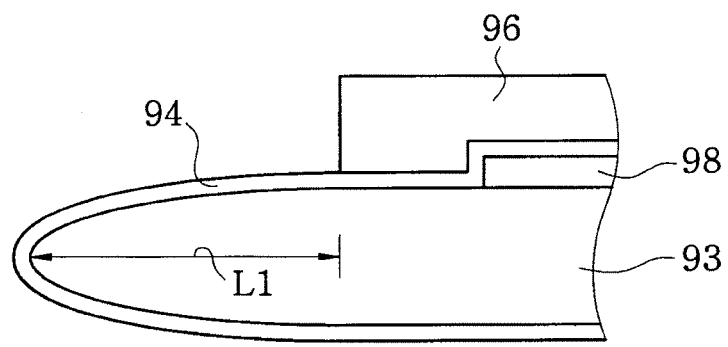

FIGS. 2 to 4 schematically illustrate a method of forming a semiconductor device according to an exemplary embodiment of the present general inventive concept.

Referring to FIGS. 2 and 4, according to an exemplary embodiment of the present general inventive concept, a semiconductor substrate 93 is prepared as illustrated in FIG. 2. The semiconductor substrate 93 has main surfaces on upper and bottom sides thereof, and a bevel region 91 connecting the main surfaces at an edge thereof. The main surfaces refer to a top surface 90 and a bottom surface 92 respectively corresponding to the upper side and the lower side of the semiconductor substrate 93. The semiconductor substrate 93 has a semiconductor chip formation region 98 on the top surface thereof as illustrated in FIG. 4. The semiconductor chip formation region 98 may be formed in plural along rows and columns of the semiconductor substrate 93. The semiconductor chip formation region 98 may correspond to a semiconductor chip through semiconductor pre- and post-processes, which are well known to those skilled in the art.

A material layer 94 is formed on the semiconductor substrate 93 as illustrated in FIG. 3. The material layer 94 may be formed to cover the top surface 90, the bevel region 91 and the bottom surface 92 of the semiconductor substrate 93. The material layer 94 may be formed to fully cover the top surface 90 and the bevel region 91 of the semiconductor substrate 93, and partially cover the bottom surface 92 thereof. The material layer 94 may be formed of an insulating and/or conductive material. A mask pattern 96 is formed on the material layer 94 as illustrated in FIG. 3. The mask pattern 96 may be formed to expose the material layer 94 disposed around an edge of the semiconductor substrate 93. The mask pattern 96 may be formed using a photoresist. The mask pattern 96 may be formed of a material having a different etch rate from the semiconductor substrate 93 and the material layer 94.

Upon checking relative positions of the material layer 94, the mask pattern 96 and the semiconductor chip formation region 98 through a check point "A" of FIG. 3, the top surface 90, bevel region 91 and bottom surface 92 of the semiconductor substrate 93 are covered with the material layer 94 as illustrated in FIG. 4. The material layer 94 also covers the semiconductor chip formation region 98 disposed on the top surface 90 of the semiconductor substrate 93. The semiconductor chip formation region 98 may be spaced a predetermined distance apart from an edge exclusion region on wafer (EEW) L1 that is well known to those skilled in the art as illustrated in FIG. 4. Here, the mask pattern 96 may be formed to extend from a central region to the EEW L1 of the semiconductor substrate 93 as illustrated in FIG. 4. The mask pattern 96 may be formed between the bevel region 91 and the semiconductor chip formation region 98.

FIGS. 5 to 8 are schematic views illustrating a method of forming a semiconductor device using the semiconductor fabrication apparatus of FIG. 1 according to an exemplary embodiment of the present general inventive concept, respectively.

Figure 5:
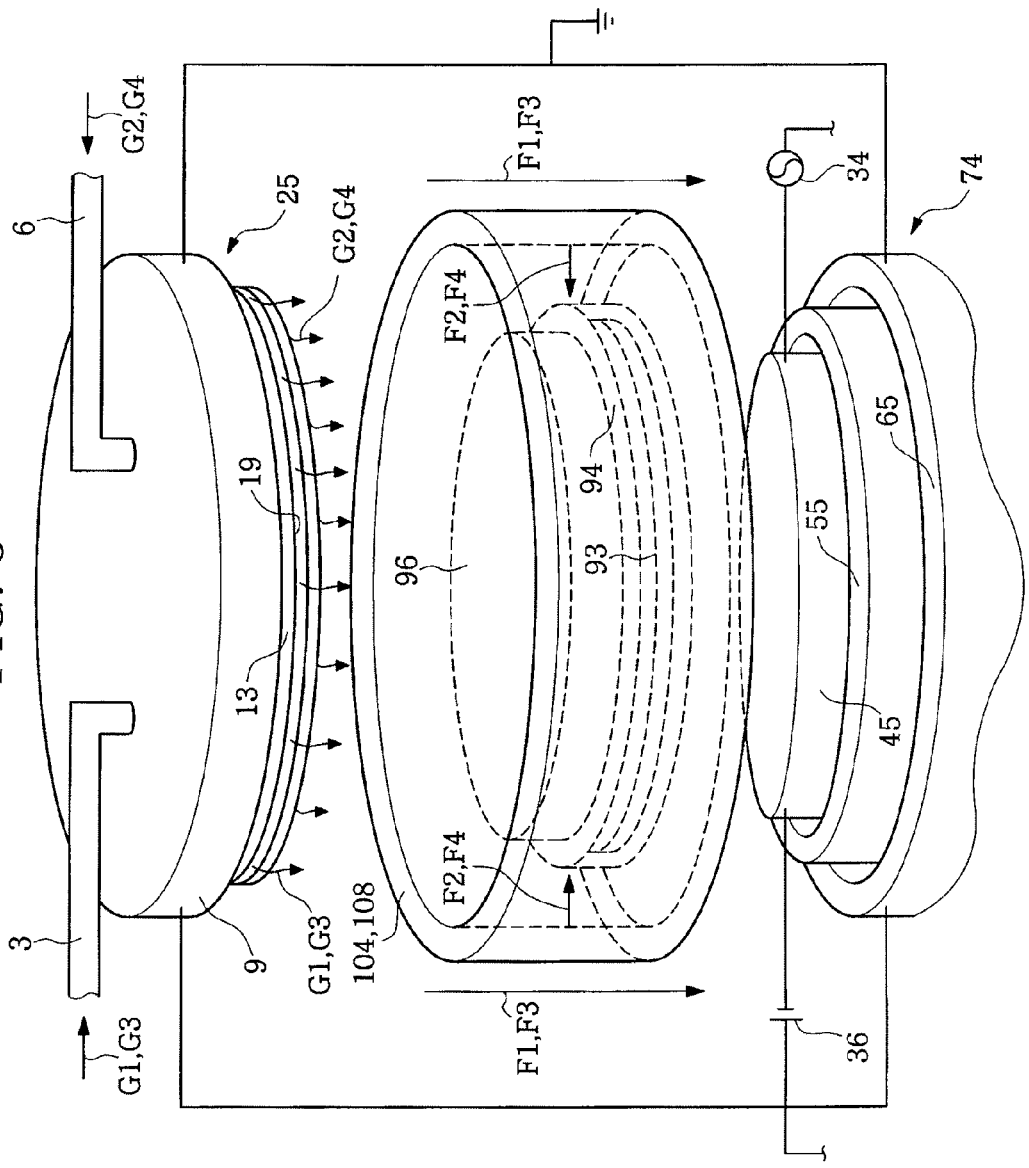

Referring to FIGS. 1 and 5, a semiconductor substrate 93 according to an exemplary embodiment is inserted into the semiconductor fabrication apparatus 80 of FIG. 1. The semiconductor fabrication apparatus 80 has upper and lower bodies 25 and 74 opposite to each other. Toward a lower side from an upper side of the semiconductor fabrication apparatus 80, the upper body 25 includes first and second gas tubes 3 and 6, an upper electrode 9 and a gas induction housing 13, and the lower body 74 includes middle and lower electrodes 45 and 65. The lower electrode 65 has a larger diameter than the middle electrode 45. The upper electrode 9 has a larger diameter than the gas induction housing 13. The gas induction housing 13 has a different diameter from the middle electrode 45. The gas induction housing 13 may be the same as the middle electrode 45. Here, the semiconductor substrate 93 may be mounted on the middle electrode 45. The semiconductor substrate 93 may be disposed on the middle electrode 45 to be out of an edge of the middle electrode 45 in all directions extending from the center of the middle electrode 45. The semiconductor fabrication apparatus 80 may perform semiconductor etching and deposition processes on the semiconductor substrate 93 using the upper and lower bodies 25 and 74.

Meanwhile, the first and second gas tubes 3 and 6 may be disposed on a top surface of the upper electrode 9, and the gas induction housing 13 may be disposed on the bottom surface of the upper electrode 9 as illustrated in FIG. 1 or 5. The gas induction housing 13 has a strip-shaped gas inducer 19 along a sidewall of the induction housing 13, and gas holes 16 in a surface thereof facing the middle electrode 45 as illustrated in FIG. 1. The first gas tube 3 is in communication with the gas holes 16 through the upper electrode 9 and the gas induction housing 13, and the second gas tube 6 is in communication with the gas inducer 19 through the upper electrode 9 and the gas induction housing 13. Alternatively, the gas induction housing 13 may have hole-shaped gas inducers (not illustrated) along the sidewall of the induction housing 13, and gas holes 16 in the respective surface facing the middle electrode 45. The first gas tube 3 may be connected to the gas holes 16 through the upper electrode 9 and the gas induction housing 13, and the second gas tube 6 may be in communication with the hole-shaped gas inducers through the upper electrode 9 and the gas induction housing 13.

To perform the semiconductor etching process, etching process gases G1 and G2 are injected into the semiconductor fabrication apparatus 80 through the first and second gas tubes 3 and 6 as illustrated in FIG. 5. One etching process gas G1 is released between the upper and lower electrodes 9 and 65 through the gas holes 16 as illustrated in FIG. 5. The one etching process gas G1 may be a reactive gas. The other etching process gas G2 is released between the upper and lower electrodes 9 and 65 through the second gas tube 6 and the gas inducer 19 of the gas induction housing 13. The other etching process gas G2 may be a carrier gas or an additive gas. When the gas induction housing 13 has hole-shaped gas inducers, the one etching process gas G1 may be released between the upper and lower electrodes 9 and 65 through the gas holes 16 of the gas induction housing 13. The other etching process gas G2 may be released between the upper and lower electrodes 9 and 65 through the second gas tube 6 and the gas inducers of the gas induction housing 13.

Figure 6:
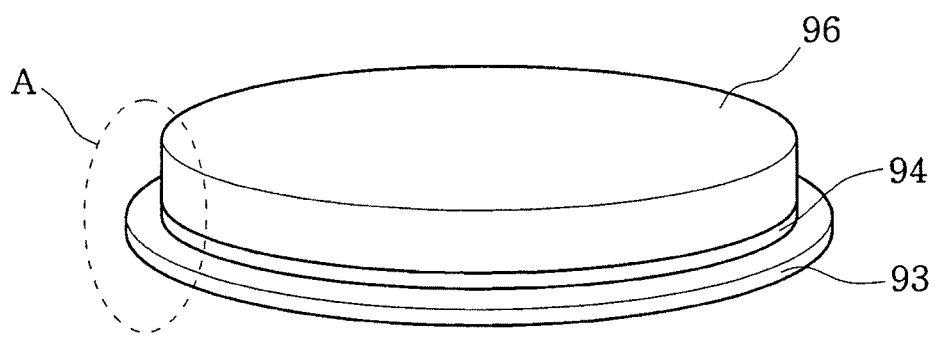

Referring to FIGS. 5 and 6, an etch power recipe is set to the upper, middle and lower electrodes 9, 45 and 65. In the etch power recipe, the upper and lower electrodes 9 and 65 may be electrically connected to each other to have the same polarity. A portion of the etch power recipe may ground the upper and lower electrodes 9 and 65, and apply RF power 34 to the middle electrode 45. The RF power 34 may form a plasma 104 between the upper, middle and lower electrodes 9, 45 and 65 using the etch process gases G1 and G2 as illustrated in FIG. 5. The plasma 104 may be formed around the edge of the semiconductor substrate 93. That is, the plasma 104 may be formed adjacent to the edge of the semiconductor substrate 93. The plasma 104 may have a volume gradually decreasing toward an edge between the gas induction housing 13 and the middle electrode 45 from an edge between the upper and lower electrodes 9 and 65.

The remaining etch power recipe may apply bias power 36 to the upper and lower electrodes 9 and 65 to form a higher electrical potential than the middle electrode 45 as illustrated in FIG. 5. The bias power 36 may generate electrical fields F1 and F2 between the upper and middle electrodes 9 and 45, so as to allow the plasma 104 to face toward the semiconductor substrate 93 corresponding to intensities of the electrical fields F1 and F2 during the semiconductor etching process. Accordingly, the semiconductor etching process may be performed to etch a material layer 94 using a mask pattern 96 as an etch mask. After the performance of the semiconductor etching process, the mask pattern 96 may continuously remain on the material layer 94 to expose the semiconductor substrate 93 as illustrated in FIG. 6.

Figure 7:
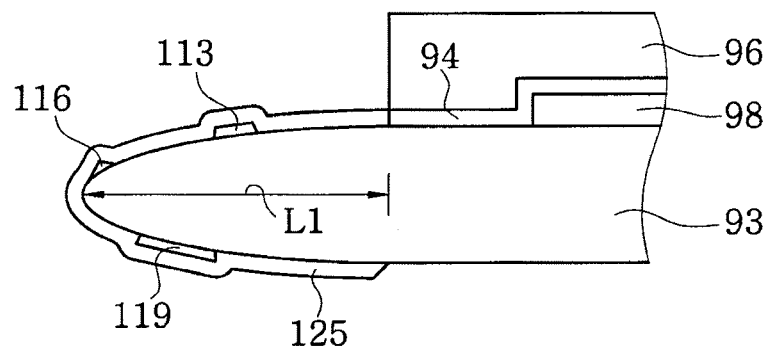

Referring to FIGS. 5 and 7, when the edge of the semiconductor substrate 93 is enlarged through a check point "A" of FIG. 6, residues 113, 116 and 119 of the material layer 94 may be viewed in an EEW L1 of the semiconductor substrate 93 by the semiconductor etching process as illustrated in FIG. 6. The residues 113, 116 and 119 of the material layer 94 may be formed on the top and bottom surfaces of the semiconductor substrate 93 in addition to the EEW L1 of the semiconductor substrate 93. After the performance of the semiconductor etching process, the etching process gases G1 and G2 are removed from a space between the upper and lower electrodes 9 and 65. The etching process gases G1 and G2 may be vented out of the apparatus 80 via a ventilation pump of the semiconductor fabrication apparatus 80 which is well know to those skilled in the art. Subsequently, to perform the semiconductor deposition process, deposition process gases G3 and G4 are injected into a space between the upper and lower electrodes 9 and 65 as illustrated in FIG. 5. The deposition process gases G3 and G4 may be applied to the semiconductor fabrication apparatus 80 through the first and second gas tubes 3 and 6. One deposition process gas G3 is released between the upper and lower electrodes 9 and 65 through gas holes 16 of the gas induction housing 13 as illustrated in FIG. 5. The one deposition process gas G3 may be a reactive gas. The one deposition process gas G3 may be formed of at least one element, which is different from or the same as that of the one etching process gas G1.

The other deposition process gas G4 is released between the upper and lower electrodes 9 and 65 through the second gas tube 6 and the gas inducer 19 of the gas induction housing 13 as illustrated in FIG. 5. The other deposition process gas G4 may be a carrier gas or an additive gas. The other deposition process gas G4 may be formed of at least one element different from that of the etching process gas G2. The other deposition process gas G4 may be formed of at least one element which is the same as that of the other etching process gas G2. In contrast, the other deposition process gas G4 may not be injected between the upper and lower electrodes 9 and 65. When the gas induction housing 13 has hole-shaped gas inducers, the one deposition process gas G3 may be released between the upper and lower electrodes 9 and 65 through the first gas tube 3 and the gas holes 16 of the gas induction housing 13. The other deposition process gas G4 may be released between the upper and lower electrodes 9 and 65 through the second gas tube 6 and the gas inducers of the gas induction housing 13.

Referring back to FIGS. 5 and 7, a deposition power recipe is set to the upper, middle and lower electrodes 9, 45 and 65. In the deposition power recipe, the upper and lower electrodes 9 and 65 may be electrically connected to each other to have the same polarity. A portion of the deposition power recipe may ground the upper and lower electrodes 9 and 65, and apply RF power 34 to the middle electrode 45. Here, the RF power 34 may form plasma 108 between the upper, middle and lower electrodes 9, 45 and 65 as illustrated in FIG. 5. The plasma 108 may be formed along an edge of the semiconductor substrate 93. That is, the plasma 108 may be formed adjacent to the edge of the semiconductor substrate 93. The plasma 108 may have a volume gradually decreasing toward the edge between the gas induction housing 13 and the middle electrode 45 from the edge between the upper and lower electrode 9 and 65. The RF power 34 of the semiconductor deposition process may be the same as that of the semiconductor etching process. The RF power 34 of the semiconductor deposition process may be different than that of the semiconductor etching process.

The remaining deposition power recipe may apply bias power 36 to the upper and lower electrodes 9 and 65 to form a higher electrical potential than the middle electrode 45 as illustrated in FIG. 5. The bias power 36 of the semiconductor deposition process may be different than that of the semiconductor etching process. The bias power 36 of the semiconductor deposition process may be the same as that of the semiconductor etching process. The bias power 36 may generate electrical fields F3 and F4 between the upper and middle electrodes 9 and 45 to form the plasma 108 toward the semiconductor substrate 93 corresponding to the intensities of the electrical fields F3 and F4 during the semiconductor etching process. Alternatively, a different deposition power recipe may be set to the upper, middle and lower electrodes 9, 45 and 65. The upper and lower electrodes 9 and 65 may be electrically connected to have the same polarity in the different deposition power recipe. The different power recipe may ground the upper and lower electrodes 9 and 65, and apply RF power 34 only to the middle electrode 45.

Figure 8:
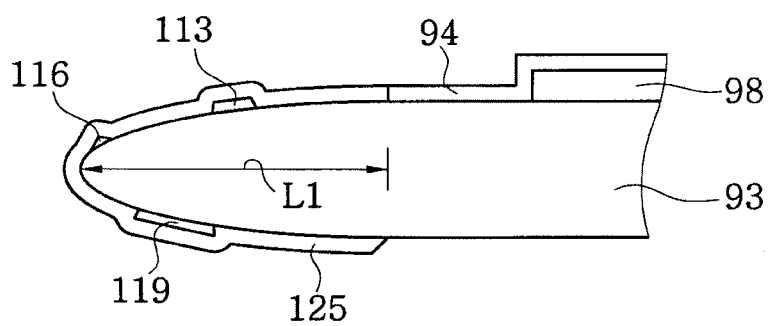

Referring to FIGS. 5, 7 and 8, during the performance of the semiconductor deposition process, a passivation layer 125 is formed on the semiconductor substrate 93 by the deposition power recipe or the different deposition power recipe using the mask pattern 96 as a mask. The passivation layer 125 may be formed along the edge of the semiconductor substrate 93 as illustrated in FIG. 7. After the performance of the semiconductor deposition process, the mask pattern 96 is removed from the semiconductor substrate 93 as illustrated in FIG. 8. The passivation layer 125 may be formed to fully cover the EEW L1 and partially cover the top and bottom surfaces of the semiconductor substrate 93 as illustrated in FIG. 8. Accordingly, the passivation layer 125 may be formed in the EEW L1 to cover the residues 113, 116 and 119 of the material layer 94.

Figure 9:
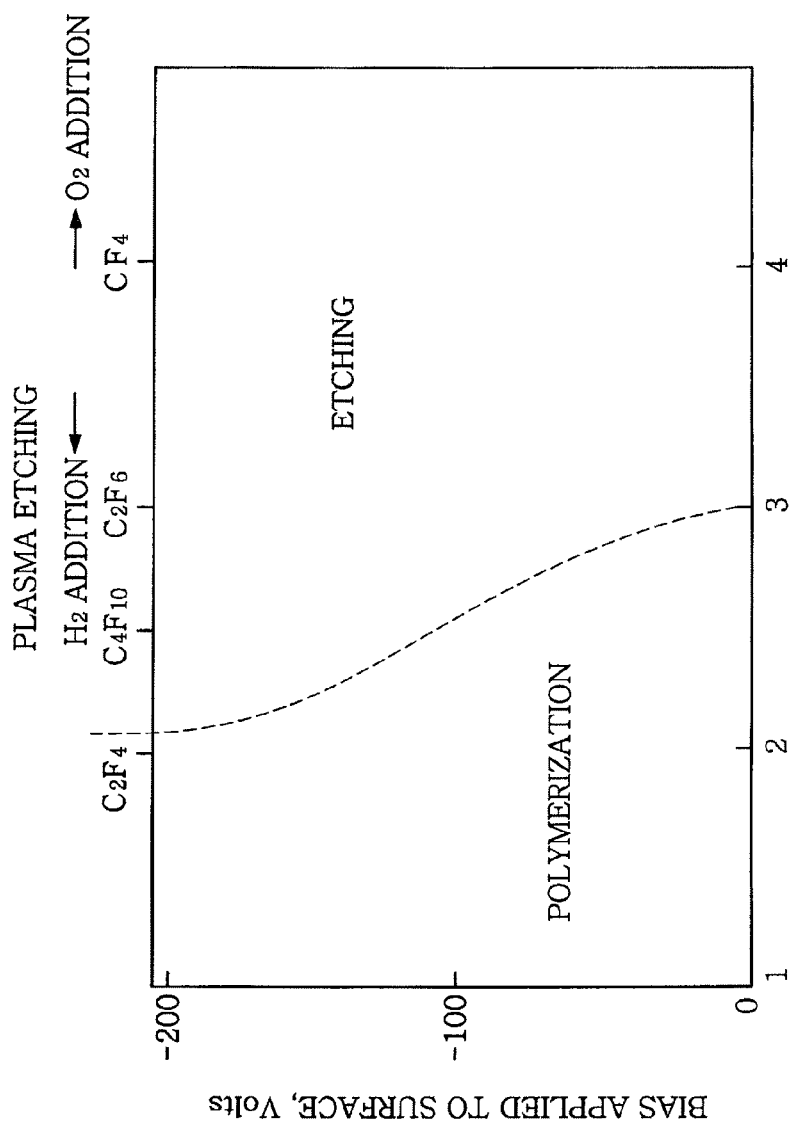
FIG. 9 is a graph illustrating characteristics of semiconductor etching and deposition processes of the semiconductor fabrication apparatus of FIG. 1.

FIG. 9 is a graph illustrating characteristics of semiconductor etching and deposition processes of a semiconductor fabrication apparatus of FIG. 1.

Referring to FIG. 9, whether the semiconductor deposition process can be performed using the semiconductor fabrication apparatus for the semiconductor etching process can be confirmed with reference to the graph of FIG. 9. The graph is illustrated in "Industrial Plasma Engineering Vol. 2. J. Reece Roth. IOP. p 583-p584." The graph illustrates a relationship between the semiconductor etching and deposition processes of the semiconductor fabrication apparatus according to a ratio of etching process gases and a magnitude of bias power. The etching process gases include a CF series gas as a reactive gas, and $H_2$ and $O_2$ gases as additive gases. The bias power is an electrical potential applied to the semiconductor substrate, and the electrical potential is represented as a relative ratio between the upper electrode (anode) and the lower electrode (cathode). Here, the semiconductor fabrication apparatus may exhibit semiconductor etching and deposition characteristics depending on a ratio of the etching process gases and a magnitude of the bias power. Thus, the semiconductor fabrication apparatus may perform the semiconductor deposition process using different etching process gases illustrated in the graph as a deposition process gas together with the semiconductor etching process. Accordingly, the present embodiment provides semiconductor fabrication apparatus 80 to perform the semiconductor etching and deposition processes based on the graph of FIG. 9.

FIGS. 10 to 16 are schematic views illustrating a method of forming a semiconductor device using the semiconductor fabrication apparatus of FIG. 1 according to another exemplary embodiment of the present general inventive concept, respectively.

Figure 10:
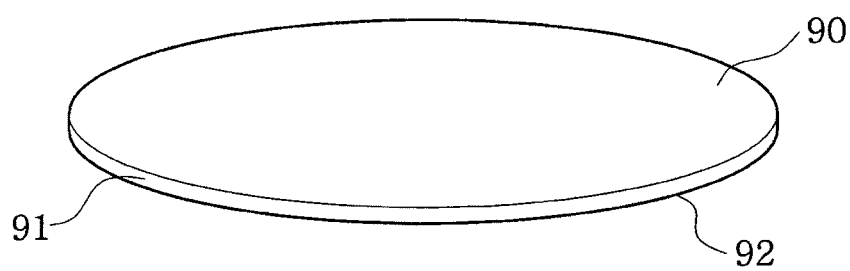
FIGS. 10 to 16 are schematic views illustrating a method of forming a semiconductor device using the semiconductor fabrication apparatus of FIG. 1 according to another exemplary embodiment of the present general inventive concept, respectively.
Figure 11:
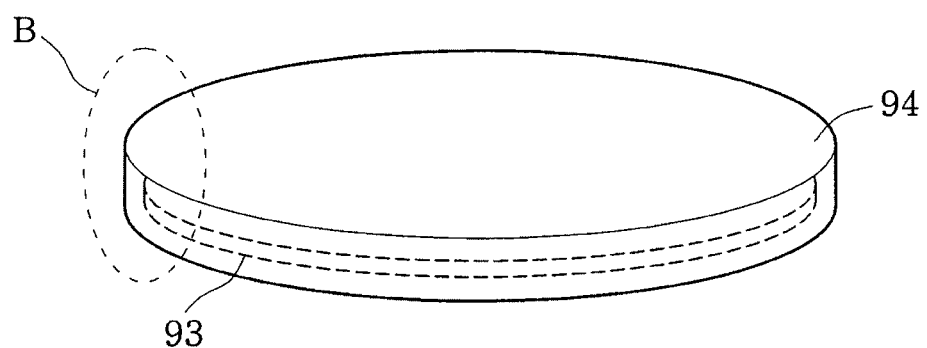
Figure 12:
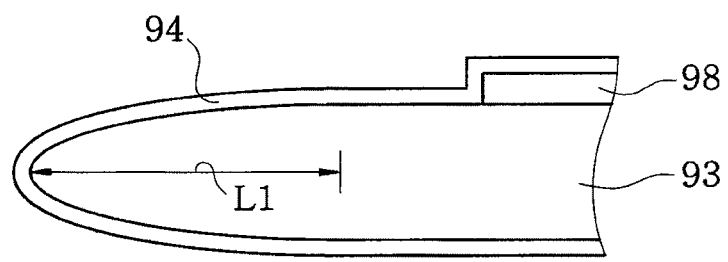

FIGS. 10 to 12 are schematic views illustrating a method of forming a semiconductor device according to another exemplary embodiment of the present general inventive concept.

Referring to FIGS. 10 and 12, according to another exemplary embodiment of the present general inventive concept, a semiconductor substrate 93 is prepared as illustrated in FIG. 10. The semiconductor substrate 93 has main surfaces on upper and lower sides thereof, and a bevel region 91 connecting the main surfaces at its edge. The main surfaces refer to a top surface 90 and a bottom surface 92 respectively corresponding to the upper and lower sides of the semiconductor substrate 93. The semiconductor substrate 93 has a semiconductor chip formation region 98 as illustrated in FIG. 12. The semiconductor chip formation region 98 may be formed plural along rows and columns of the semiconductor substrate 93. The semiconductor chip region 98 may correspond to a semiconductor chip through semiconductor pre- or post-processes well known to those skilled in the art.

A material layer 94 is formed on the semiconductor substrate 93 as illustrated in FIG. 11. The material layer 94 may be formed to cover the top surface 90, the bevel region 91 and the bottom surface 92. The material layer 94 may be formed to fully cover the top surface 90 and the bevel region 91 of the semiconductor substrate 93, and partially cover the bottom surface 92 thereof. The material layer 94 may be formed of an insulating and/or conductive material. When a check point "B" of FIG. 11 is enlarged, the material layer 94 may be viewed to cover the top surface 90, bevel region 91 and bottom surface 92 of the semiconductor substrate 93 as illustrated in FIG. 12. The material layer 94 may cover the semiconductor chip formation region 98. The semiconductor chip formation region 98 may be spaced by a predetermined distance apart from an EEW L1 well known to those skilled in the art as illustrated in FIG. 12.

FIGS. 13 to 16 are schematic views illustrating a method of forming a semiconductor device using the semiconductor fabrication apparatus of FIG. 1 according to another exemplary embodiment of the present general inventive concept.

Figure 13:
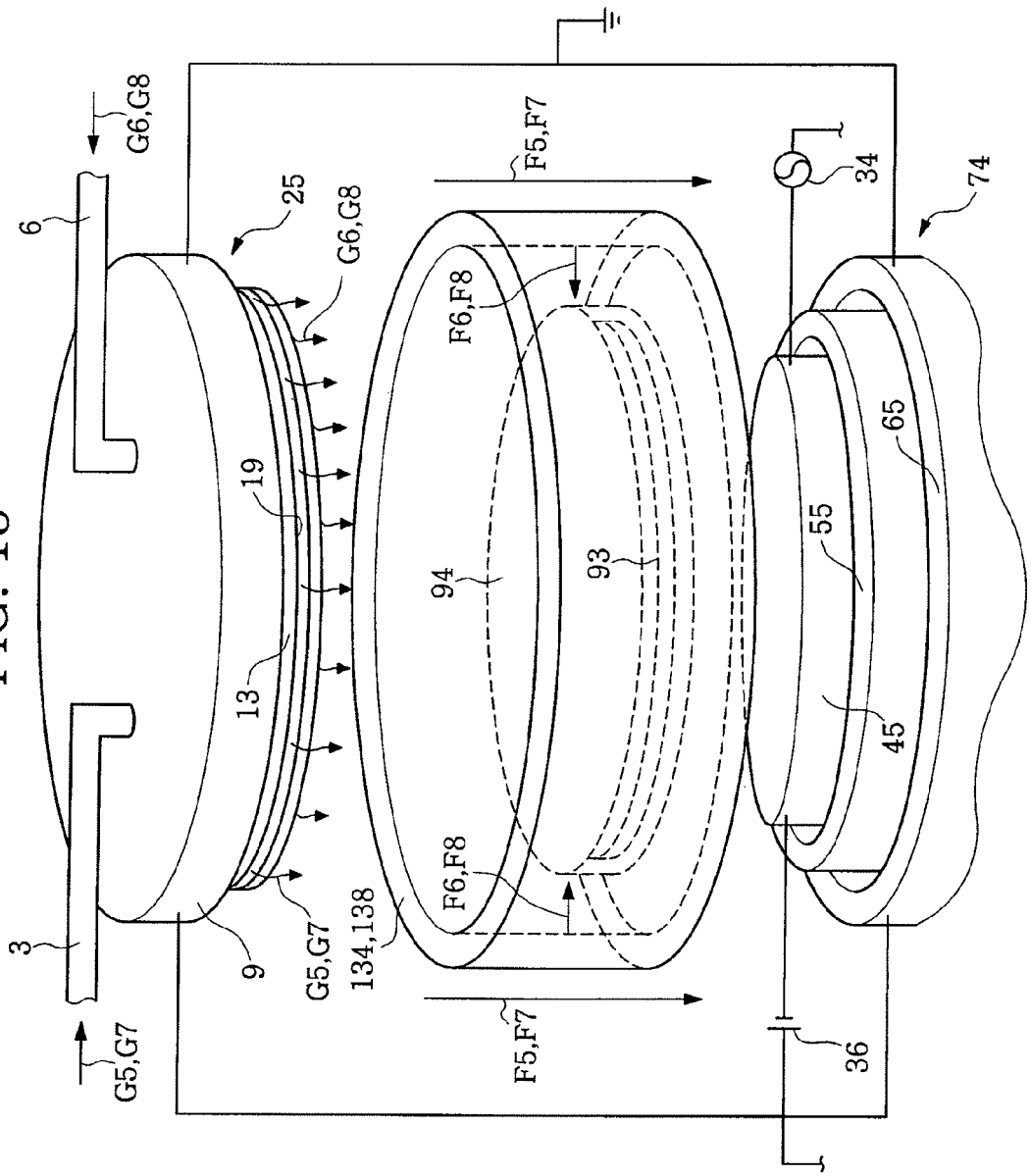

Referring to FIGS. 1 and 13, a semiconductor substrate 93 is put into the semiconductor fabrication apparatus 80 of FIG. 1. The semiconductor fabrication apparatus 80 includes lower and upper bodies 74 and 25. Toward a lower side from an upper side of the semiconductor fabrication apparatus 80, the upper body 25 has first and second gas tubes 3 and 6, an upper electrode 9 and a gas induction housing 13, and the lower body 74 has middle and lower electrodes 45 and 65. The lower electrode 65 has a larger diameter than the middle electrode 45. The upper electrode 9 has a larger diameter than the gas induction housing 13. The gas induction housing 13 has a different diameter than the middle electrode 45. The gas induction housing 13 may have the same diameter as the middle electrode 45. Here, the semiconductor substrate 93 may be mounted on the middle electrode 45. The semiconductor substrate 93 may be disposed on the middle electrode 45 to be out of an edge of the middle electrode 45 extending in all directions from the center of the middle electrode 45. The semiconductor fabrication apparatus 80 may perform semiconductor etching and deposition processes on the semiconductor substrate 93 using the upper and lower bodies 25 and 74.

Meanwhile, the first and second gas tubes 3 and 6 may be disposed on a top surface of the upper electrode 9, and the gas induction housing 13 may be disposed on a bottom surface of the upper electrode 9 as in FIG. 1 or 13. The gas induction housing 13 has a strip-shaped gas inducer 19 along a sidewall of the induction housing 13 and gas holes 16 in a surface thereof facing the middle electrode 45. The first gas tube 3 is in communication with the gas holes 16 through the upper electrode 9 and the gas induction housing 13, and the second gas tube 6 is in communication with the gas inducer 19 through the upper electrode 9 and the gas induction housing 13. Alternatively, the gas induction housing 13 may have hole-shaped gas inducers (not illustrated) along the sidewall of the induction housing 13, and gas holes 16 in the surface facing the middle electrode 45. The first gas tube 3 may be in communication with the gas holes 16 through the upper electrode 9 and the gas induction housing 13, and the second gas tube 6 may be in communication with the hole-shaped gas inducers through the upper electrode 9 and the gas induction housing 13.

In order to perform the semiconductor etching process, etching process gases G5 and G6 are inserted into the semiconductor fabrication apparatus 80 through the first and second gas tubes 3 and 6 in FIG. 13. The one etching process gas G5 is released between the upper and lower electrodes 9 and 65 through the first gas tube 3 and the gas holes 16 of the gas induction housing 13 as illustrated in FIG. 13. The one etching process gas G5 may be a reactive gas. The other etching process gas G6 is released between the upper and lower electrode 9 and 65 through the second gas tube 6 and the gas inducer 19 of the gas induction housing 13 in FIG. 13. The other gas etching process gas G6 may be a carrier gas or an additive gas. When the gas induction housing 13 has hole-shaped gas inducers, the one etching process gas G5 may be released between the upper and lower electrodes 9 and 65 through the first gas tube 3 and the gas holes 16 of the gas induction housing 13. The other etching process gas G6 may be released between the upper and lower electrodes 9 and 65 through the second gas tube 6 and the gas inducers of the gas induction housing 13.

Figure 14:
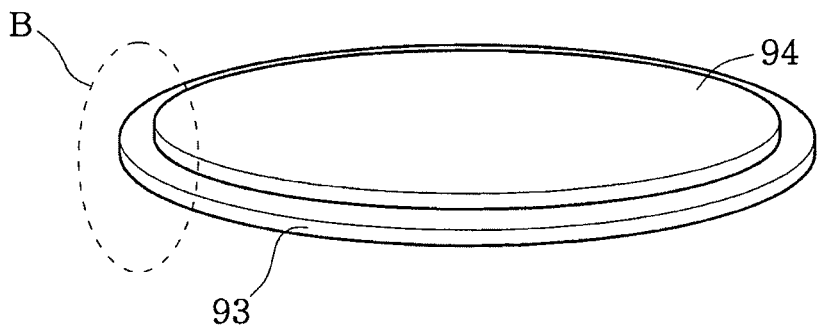

Referring to FIGS. 13 and 14, an etching power recipe is set to upper, middle and lower electrodes 9, 45 and 65. In the etching power recipe, the upper and lower electrodes 9 and 65 may be electrically connected to each other to have the same polarity. A portion of the etching power recipe may ground the upper and lower electrodes 9 and 65, and apply RF power 34 to the middle electrode 45. Here, the RF power 34 may form plasma 134 between the upper, middle and lower electrodes 9, 45 and 65 using the etching process gases G5 and G6. The plasma 134 may be formed along the edge of the semiconductor substrate 93. That is, the plasma 134 may be formed adjacent to the edge of the semiconductor substrate 93. The plasma 134 may have a volume gradually decreasing toward an edge between the gas induction housing 13 and the middle electrode 45 from an edge between the upper and lower electrodes 9 and 65.

The remaining etching power recipe may apply a bias power 36 to the upper and lower electrodes 9 and 65 to generate a higher electrical potential than the middle electrode 45 as illustrated in FIG. 13. The bias power 36 may generate electrical fields F5 and F6 between the upper and middle electrodes 9 and 45 to form the plasma 134 toward the semiconductor substrate 93 corresponding to intensities of the electrical fields F5 and F6 in the semiconductor etching process. Accordingly, the semiconductor etching process may be performed to etch the material layer 94 existing within a range of forming the plasma 134 of the etching process gases G5 and G6 by the etching power recipe. The material layer 94 may be formed to expose the edge of the semiconductor substrate 93 as illustrated in FIG. 14.

Figure 15:
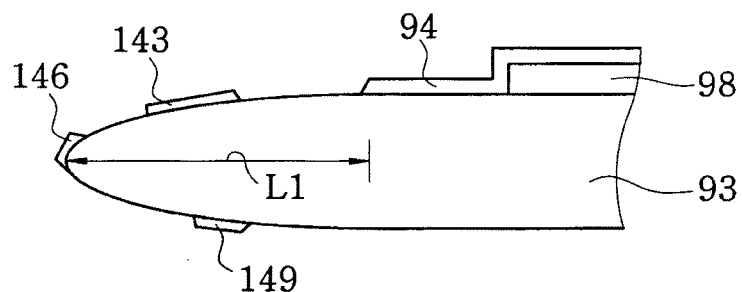

Referring to FIGS. 13 and 15, when the edge of the semiconductor substrate 93 is enlarged through the check point "B" of FIG. 14, residues 143, 146 and 149 of the material layer 94 may be viewed in an EEW L1 of the semiconductor substrate 93 as illustrated in FIG. 15. The residues 143, 146 and 149 of the material layer may be formed on the top and bottom surfaces of the semiconductor substrate 93 including the EEW L1 of the semiconductor substrate 93 by the semiconductor etching process. After the performance of the semiconductor etching process, the etching process gases G5 and G6 are removed from a space between the upper and lower electrodes 9 and 65. The etching process gases G5 and G6 may be vented out of the semiconductor fabrication apparatus 80 through a ventilation pump of the apparatus 80 well known to those skilled in the art. Subsequently, in order to perform the semiconductor deposition process, deposition process gases G7 and G8 are injected between the upper and lower electrodes 9 and 65 in FIG. 13. The deposition process gases G7 and G8 may be injected into the semiconductor fabrication apparatus 80 through the first and second gas tubes 3 and 6. The one deposition process gas G7 is released between the upper and lower electrodes 9 and 65 through the first gas tube 3 and the gas holes 16 of the gas induction housing 13 as illustrated in FIG. 13. The one deposition process gas G7 may be a reactive gas. The one deposition process gas G7 may be formed of at least one element different from or the same as the one etching process gas G5.

The other deposition process gas G8 is released between the upper and lower electrodes 9 and 65 through the second gas tube 6 and the gas inducer 19 of the gas induction housing 13 as illustrated in FIG. 13. The other deposition process gas G8 may be a carrier gas or an additive gas. The other deposition process gas G8 may be formed of at least one element that is different from or the same as the other etching process gas G6. Alternatively, the other deposition process gas G8 may not be injected between the upper and lower electrodes 9 and 65. When the gas induction housing 13 has hole-shaped gas inducers, the one deposition process gas G7 may be released between the upper and lower electrodes 9 and 65 through the first gas tube 3 and the gas holes 16 of the gas induction housing 13. The other deposition process gas G8 may be released between the upper and lower electrodes 9 and 65 through the second gas tube 6 and the hole-shaped gas inducers of the gas induction housing 13.

Referring back to FIGS. 13 and 15, a deposition power recipe is set to the upper, middle and lower electrodes 9, 45 and 65. In the deposition power recipe, the upper and lower electrodes 9 and 65 may be electrically connected to each other to have the same polarity. A portion of the deposition power recipe may ground the upper and lower electrodes 9 and 65, and apply the RF power 34 to the middle electrode 45. Here, the RF power 34 may generate the plasma 138 between the upper, middle and lower electrodes 9, 45 and 65 as illustrated in FIG. 13. The plasma 138 may be generated along the edge of the semiconductor substrate 93. That is, the plasma 138 may be formed adjacent to the edge of the semiconductor substrate 93. The plasma 138 may have a volume gradually decreasing toward the edge between the gas induction housing 13 and the middle electrode 45 from the edge between the upper and lower electrodes 9 and 65. The RF power 34 of the semiconductor deposition process may be different than that of the semiconductor etching process. The RF power 34 of the semiconductor deposition process may be the same as that of the semiconductor etching process.

The remaining deposition power recipe may apply the bias power 36 to the upper and lower electrodes 9 and 65 to have a higher electrical potential than the middle electrode 45 as illustrated in FIG. 13. The bias power 36 of the semiconductor deposition process may be different than that of the semiconductor etching process. The bias power 36 of the semiconductor deposition process may be the same as that of the semiconductor etching process. The bias power 36 may generate electrical fields F7 and F8 between the upper and middle electrodes 9 and 45 to form the plasma 138 toward the semiconductor substrate 93 corresponding to the intensity of the electrical fields F7 and F8 during the semiconductor etching process. Alternatively, another deposition power recipe may be set to the upper, middle and lower electrodes 9, 45 and 65. The upper and lower electrodes 9 and 65 may be electrically connected to each other to have the same polarity. The deposition power recipe may ground the upper and lower electrodes 9 and 65, and apply the RF power 34 only to the middle electrode 45.

Figure 16:
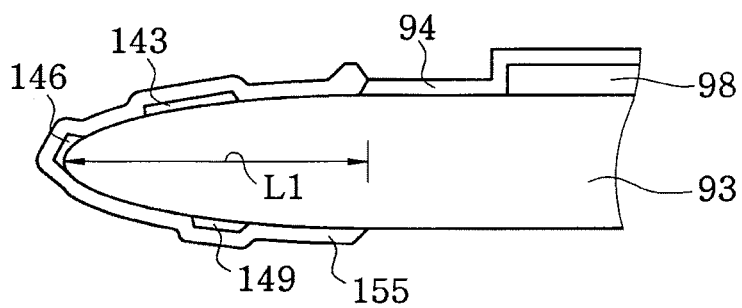

Referring to FIGS. 13, 15 and 16, a passivation layer 155 may be formed on the semiconductor substrate 93 existing in a range of forming the plasma 138 of the deposition process gas using the deposition power recipe or the different deposition power recipe during the performance of the semiconductor deposition process. The passivation layer may be formed along the edge of the semiconductor substrate 93. After the performance of the semiconductor deposition process, the passivation layer 155 may be formed to fully cover the EEW L1, and partially cover the top and bottom surfaces of the semiconductor substrate 93. Accordingly, the passivation layer 155 may be formed in the EEW L1 to cover the residues 143, 146 and 149 of the material layer 94.

As described above, various embodiments of semiconductor fabrication apparatus performing semiconductor etching and deposition processes and methods of forming a semiconductor device using the same are provided. Accordingly, during the performance of the semiconductor etching and deposition processes, a semiconductor substrate is disposed at a predetermined position to shorten a moving line of the semiconductor fabrication process resulting in a decrease in production cost of the semiconductor device.

Although various embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A method of fabricating a semiconductor device using a semiconductor fabrication apparatus having lower and upper bodies facing each other in which, toward a lower side from an upper side of the semiconductor fabrication apparatus, the upper body has gas tubes, an upper electrode and a gas induction housing, and the lower body has middle and lower electrodes, and performing semiconductor etching and deposition processes, the method comprising:
   preparing a semiconductor substrate;
   mounting the semiconductor substrate on the middle electrode;
   injecting etching process gases between the upper and lower electrodes;
   performing the semiconductor etching process on the semiconductor substrate by setting an etching power recipe to the upper, middle and lower electrodes;
   removing the etching process gases from the upper and lower electrodes after performance of the semiconductor etching process;
   injecting deposition process gases between the upper and lower electrodes; and
   performing the semiconductor deposition process onto the semiconductor substrate by setting a deposition power recipe to the upper, middle and lower electrodes,
   wherein the etching and deposition process gases are converted into plasma, respectively, corresponding thereto according to the etching and deposition recipes, and the plasma is formed along an edge of the semiconductor substrate, during the semiconductor etching and deposition processes,
   wherein a diameter of the lower electrode is larger than a diameter of the middle electrode, a diameter of the upper electrode is larger than a diameter of the gas induction housing, and a diameter of the gas induction housing is different from that of the middle electrode.

2. The method according to claim 1, the preparing the semiconductor substrate comprises:
   forming a material layer on the semiconductor substrate; and
   forming a mask pattern on the material layer to expose the material layer disposed at the edge of the semiconductor substrate.

3. The method according to claim 2, the performing the semiconductor etching process comprises:
   etching the material layer using the mask pattern as an etch mask to expose the semiconductor substrate during the performance of the semiconductor etching process according to the etching power recipe.

4. The method according to claim 3, the setting the etching power recipe comprises:
   the upper and lower electrodes are electrically connected to each other to have a same polarity in the etching power recipe, a portion of the etching power recipe grounds the upper and lower electrodes and applies RF power to the middle electrode, and the remaining etching power recipe applies bias power to the upper and lower electrodes to generate a higher electrical potential than the middle electrode.

5. The method according to claim 4, the performing the semiconductor deposition process comprises:
   forming a passivation layer at the edge of the semiconductor substrate using the mask pattern as a mask during the performance of the semiconductor deposition process according to the deposition power recipe.

6. The method according to claim 5, the setting the deposition power recipe comprises:
   the upper and lower electrodes are electrically connected to each other to have the same polarity in the deposition power recipe, a portion of the deposition power recipe grounds the upper and lower electrodes and applies RF power to the middle electrode, and the remaining deposition power recipe applies bias power to the upper and lower electrodes to generate a higher electrical potential than the middle electrode.

7. The method according to claim 5, the setting the deposition power recipe comprises:
   the upper and lower electrodes are electrically connected to each other to have the same polarity in the deposition power recipe which grounds the upper and lower electrodes and applies RF power to the middle electrode.

8. The method according to claim 1, the preparing the semiconductor substrate comprises:
   forming a material layer on the semiconductor substrate.

9. The method according to claim 8, the performing the semiconductor etching process comprises:
   etching the material layer existing in a range of the plasma formed from the etching process gas to expose the semiconductor substrate during the performance of the semiconductor etching process according to the etching power recipe.

10. The method according to claim 9, the setting the etching power recipe comprises:
    the upper and lower electrodes are electrically connected to each other to have a same polarity in the etching power recipe, a portion of the etching power recipe grounds the upper and lower electrodes and applies RF power to the middle electrode, and the remaining etching power recipe applies bias power to the upper and lower electrodes to generate a higher electrical potential than the middle electrode.

11. The method according to claim 10, the performing the semiconductor deposition process comprises:
    forming a passivation layer at the edge of the semiconductor substrate existing in a range of the plasma formed from the deposition process gas during the performance of the semiconductor deposition process according to the deposition power recipe.

12. The method according to claim 11, the setting the deposition power recipe comprises:
    the upper and lower electrodes are electrically connected to each other to have the same polarity in the deposition power recipe, a portion of the deposition power recipe grounds the upper and lower electrodes and applies RF power to the middle electrode, and the remaining deposition power recipe applies bias power to the upper and lower electrodes to generate a higher electrical potential than the middle electrode.

13. The method according to claim 11, the setting the deposition power recipe comprises:
    the upper and lower electrodes are electrically connected to each other to have the same polarity in the deposition power recipe which grounds the upper and lower electrodes and applies the RF power to the middle electrode.

14. The method according to claim 1, wherein the gas tubes and the gas induction housing are disposed respectively on top and bottom surfaces of the upper electrode, the gas induction housing has a strip-shaped gas inducer along the housing and gas holes in a surface thereof facing the middle electrode, one of the gas tubes is in communication with the gas holes through the upper electrode and the gas induction housing, and an other gas tube is in communication with the strip-shaped gas inducer through the upper electrode and the gas induction housing,
    the injecting the etching process gases comprises:
    releasing one of the etching process gases between the lower and upper electrodes through one of the gas tubes and the gas holes of the gas induction housing; and
    releasing another of the etching process gases between the lower and upper electrodes through the other gas tube and the strip-shaped gas inducer of the gas induction housing.

15. The method according to claim 1, wherein the gas tubes and the gas induction housing are disposed respectively on top and bottom surfaces of the upper electrode, the gas induction housing has a strip-shaped gas inducer along a sidewall of the housing and gas holes in a surface thereof facing the middle electrode, one of the gas tubes is in communication with the gas holes through the upper electrode and the gas induction housing, and an other gas tube is in communication with the gas inducer through the upper electrode and the gas induction housing,
    the injecting the deposition process gases comprises:
    releasing one of the deposition process gases between the lower and upper electrodes through one of the gas tubes and the gas holes of the gas induction housing; and
    releasing another of the deposition process gases between the lower and upper electrodes through the other gas tube and the strip-shaped gas inducer of the gas induction housing.

16. The method according to claim 1, wherein
    the mounting the semiconductor substrate on the middle electrode comprises:
    forming the semiconductor substrate to be disposed on the middle electrode to be out of an edge of the middle electrode extending in all directions from a center of the middle electrode.

17. The method according to claim 16, wherein the plasma has a volume gradually decreasing toward the edge between the middle electrode and the gas induction housing from an edge between the lower and upper electrodes.

* * * * *